United States Patent [19]

Latz et al.

[11] Patent Number: 4,954,201

[45] Date of Patent: Sep. 4, 1990

[54] APPARATUS FOR ETCHING SUBSTRATES WITH A LUMINOUS DISCHARGE

[75] Inventors: Rudolf Latz, Rodgau-Dudenhofen; Thomas Martens, Krombach, both of Fed. Rep. of Germany

[73] Assignee: Leybold Aktiengesellschaft, Hanau I, Fed. Rep. of Germany

[21] Appl. No.: 277,137

[22] Filed: Nov. 29, 1988

[30] Foreign Application Priority Data

Oct. 15, 1988 [DE] Fed. Rep. of Germany ....... 3855153

[51] Int. Cl.$^5$ .................... H01L 21/306; C23C 14/34
[52] U.S. Cl. ................................ 156/345; 156/643; 204/298.31; 204/298.34
[58] Field of Search ................ 156/345, 643; 204/298 MS, 298 AN, 298 E, 298 EP, 298 PP

[56] References Cited

U.S. PATENT DOCUMENTS

| 4,310,759 | 1/1982 | Oechsner | 250/309 |
| 4,624,767 | 1/1986 | Obinata | 156/345 |
| 4,767,641 | 9/1988 | Kieser et al. | 156/345 |

FOREIGN PATENT DOCUMENTS

| 0235770 | 2/1987 | European Pat. Off. |  |
| 2115590 | 10/1972 | Fed. Rep. of Germany . |  |
| 2241229 | 3/1974 | Fed. Rep. of Germany . |  |
| 2950329 | 6/1981 | Fed. Rep. of Germany . |  |
| 3500328 | 1/1985 | Fed. Rep. of Germany . |  |
| 58-56338 | 4/1983 | Japan . |  |
| 58-125831 | 7/1983 | Japan . |  |
| 0067922 | 4/1986 | Japan | 156/345 |
| 2109282 | 6/1983 | United Kingdom . |  |

OTHER PUBLICATIONS

"Application of Plasma Processes to VLSI Technology", T. Sugano, John Wiley & Sons, NY/Chichester/Brisbane/Toronto/Singapore.

Primary Examiner—David L. Lacey
Assistant Examiner—Todd J. Burns
Attorney, Agent, or Firm—Felfe & Lynch

[57] ABSTRACT

In an apparatus for etching substrates (18) with a luminous discharge in a vacuum, containing a vacuum chamber (13), a substrate holder (17), an electrode (20, 21, 22) and a radiofrequency generator (24) whose output is connected on the one hand to the substrate holder and on the other hand to the electrode (20, 21, 22, 28), the electrode (20) opposite the substrate (17) and at least partially surrounded by a pot-like, grounded shield (23) is provided in the marginal zone with a projection rim (22) which is at the same potential and which spans the space between the electrode and the substrate (18) or substrate holder (17) except for a gap, while on the circumferential bottom margin of the approximately cylindrical projection rim (22) of the diode (20) a diaphragm ring (28) is provided which extends radially inwardly in a plane parallel to the substrate (18). To achieve a displacement of the marginal etch pit that occurs in anode sputtering, the pot-like shield (23) has a ring (26) of electrically insulating material which extends inwardly radially from its marginal portion (29) overlapping the projection rim (22) of the electrode (20), in a plane parallel to the substrate (18), to a point close to the outer margin (30) of the substrate (18).

6 Claims, 1 Drawing Sheet

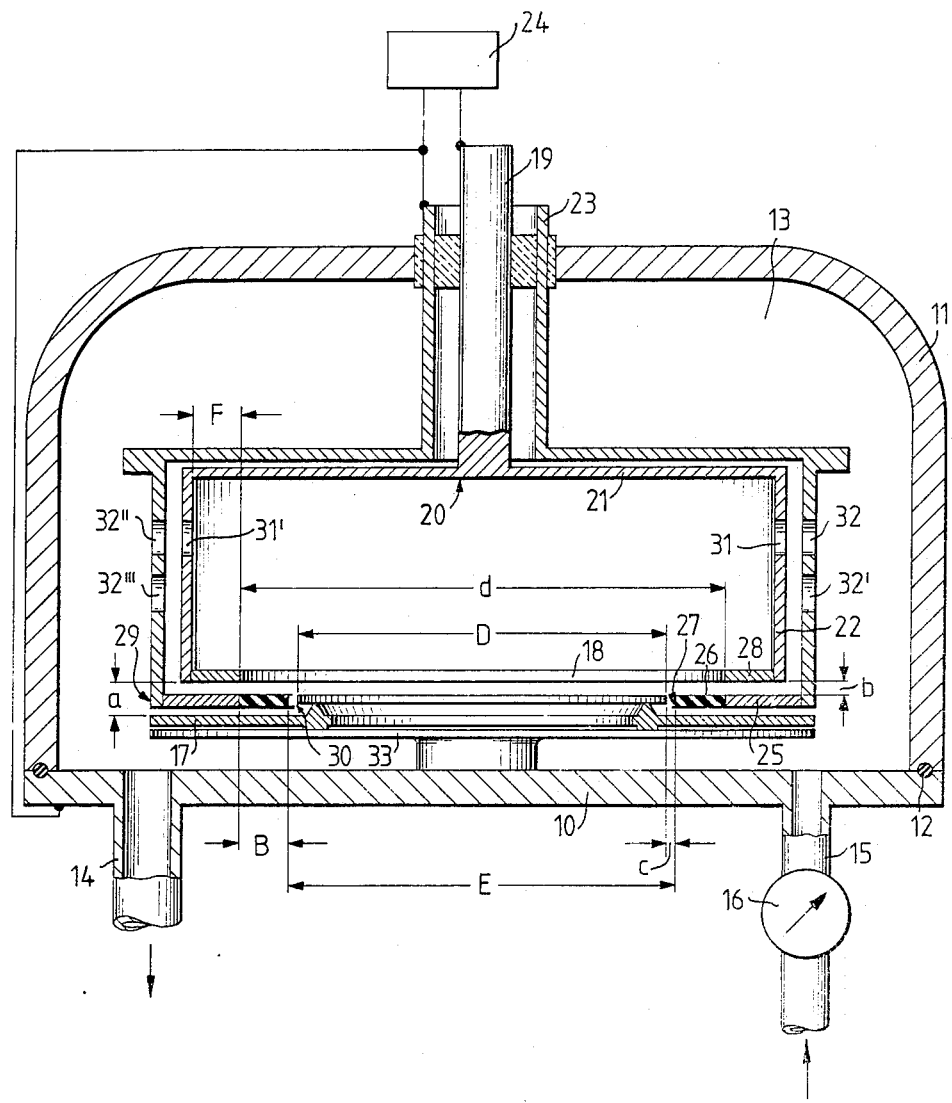

APPARATUS FOR ETCHING SUBSTRATES WITH A LUMINOUS DISCHARGE

BACKGROUND OF THE INVENTION

The invention relates to an apparatus for etching substrates with a luminous discharge in a vacuum, containing a vacuum chamber, a substrate holder, an electrode disposed opposite the substrate holder and substrates, and a radiofrequency generator with an output frequency above 100 kHz, preferably between 1 and 50 MHz, which is connected on the one hand to the substrate holder and on the other hand to the electrode. The electrode situated opposite the substrate holder and at least partially enclosed by a pot-shaped, grounded shield is provided in the marginal area with a projection which is at the same potential and spans the space between the electrode and the substrate holder except for a gap, such that the luminous discharge can be limited to the space between substrate and electrode.

It is known that a sputtering process can be performed by means of a high-frequency voltage between two electrodes if the electrode (target) consisting of the material to be sputtered is of smaller area than the counter-electrode. Then not only the substrate and the grounded substrate holder serve as the counter-electrode but also the likewise grounded chamber walls. As a result of these considerable differences in area, a substantially greater charge density occurs on the electrode being sputtered, and this is to be attributed to the different mobility of the charge carrier in the electrical field.

To limit the luminous discharge to the immediate area between cathode and anode, and consequently for the achievement of a high and uniform deposition rate, it has already been proposed in DE-OS No. 21 15 590 to provide the marginal zone of the cathode with a projection spanning the space between a discoidal part of the cathode and the substrate holder except for a gap, which in this case amounts to 5 mm. Due to the design of the power supply system, however, the apparatus in question is suitable only for coating the substrates, not for etching them. In the proposed system, at first the grounded electrode (substrate surface, substrate holder) was smaller than the area of the counter-electrode (target).

In the state of the art, different apparatus have had to be used for etching, on the one hand, and for coating, on the other. Yet even if two such systems were to be integrated in a single vacuum apparatus, if the separation of the electrical systems is to be complete, it would be necessary to provide additional insulation measures, shielding, and various impedance matching networks. This is because in the cathode sputtering process material is removed from the cathode by the effect of the luminous discharge, and deposited on the substrate, it is possible in the state of the art to remove material from the substrates by reversing the polarity, i.e., to etch the substrates. Such an etching process is suitable especially for the production of integrated circuits in which a pattern can be produced on the substrate by known techniques, the application of masks and appropriate photoresist varnishes.

Inasmuch as the substrate and its holder become the cathode in this known reversal of polarity, a good etching action is achieved, but as far as the apparatus is concerned, it becomes very complex, namely when substrates are to be alternately coated and etched in a continuous succession of operations. This would entail a constant change of the polarity of the substrates, which runs into considerable difficulty on account of the systems used for transporting the substrates. In substrates which are arranged, for example, on a round table and then carried through different work stations within the same or different vacuum chambers, such alternation of polarity would be extremely complicated.

Lastly, an apparatus for etching substrates by a luminous discharge in a vacuum is known (DE No. 22 41 229), containing a vacuum chamber, a substrate holder, an electrode, and a radiofrequency generator with an output frequency above 100 kHz, whose output electrodes are connected on the one hand to the substrate holder and on the other hand to the electrode. This known apparatus, however, also has the disadvantage that, in the etching of silicon wafers, a no more than satisfactory uniformity of the etching can be achieved.

SUMMARY OF THE INVENTION

It is the purpose of the present invention to improve the uniformity of the etching, especially in the case of substrates of different size, and in addition also to prevent the etch pit at the margin, which is typical of diode sputtering.

At the circumferential bottom margin of the approximately cylindrical projecting rim of the electrode, a shielding ring extending radially inwardly in a plane parallel to the substrate is provided. The pot-shaped shield bears a ring of electrically insulating material which runs radially inwardly from its marginal portion overlapping the projection of the electrode, in a plane parallel to the substrate, to a point close to the outer margin of the substrate.

BRIEF DESCRIPTION OF THE DRAWING

The FIGURE is a longitudinal section through an apparatus for etching substrates by a luminous discharge.

DETAILED DESCRIPTION OF THE PREFERRED EMBODIMENT

In the FIGURE, 10 identifies a base plate on which an airtight bell 11 rests with the interposition of a gasket of circular cross section 12. These parts together form a vacuum chamber 13 which can be evacuated by vacuum pumps, not shown, through a line 14. An inert gas suitable for the etching process, such as argon for example, is fed through an additional line 15 provided with a regulating valve 16.

In the vacuum chamber 13 there is disposed a substrate holder 17 on which rests the substrate 18 which is to be etched. Above the substrate holder an electrode 20 (anode) is mounted on a rod 19 which simultaneously serves as a power feeding conductor; the electrode 20 consists of a disk like part 21 and a cylindrical projecting rim 22 which simultaneously constitutes the margin of the electrode. The disk-like part 21 is at a distance from the surface of the substrate 18, as is also the case in conventional cathode sputtering apparatus. The cylindrical rim 22 spans the distance between the disk-like part 21 and substrate 18 except for a small gap b. This is what determines the height of the cylindrical projection [rim]. The electrode 20 and its rod 19 are surrounded on their entire outer surface situated within the vacuum by a grounded shield 23 which prevents the surface glow from covering the portions of the surface in question. A power supply system consists of a radiofrequency generator 24 whose frequency is tunable between 10 and 15 MHz (as shown).

The grounded shield 23 is connected at its bottom circumferential margin to a shielding ring 25 which extends inwardly like a flange in a horizontal plane, namely in a plane in which the substrate 18 is held. The shielding ring 25 fastened to the marginal portion of the grounded shield 23 is in turn connected to a circular insulator ring 26 whose radially inner margin 27 is at only a slight distance c from the marginal portion 30 of the substrate 18. The pot-like anode 20 and its cylindrical projection are provided with a diaphragm ring 28 which is fastened to the bottom circumferential edge of the projection 22 and extends in a plane that is parallel to the plane of the shielding ring 25 of the grounded shield 23.

Underneath the substrate holder 17 is held a circular shielding and igniting plate 33 on which the substrate holder 17 provided with a central opening rests. This prevents the burning of an additional plasma behind the substrate, especially in the case of a substrate holder provided with openings. To assure reliable exchange of gases between the individual spaces, both the cylindrical projection [rim]22 of electrode 21 and the shield 23 are provided with holes or openings 31, 31', ... and 32, 32', ....

It is desirable that the size or inside diameter d of the circular diaphragm ring 28 of the anode be adaptable, or replaceable for adaptation, to the size or diameter D of the substrate 18. Also, the target ring insert or insulator ring 26 (of electrically nonconductive material) is removably fastened to the shielding ring 25, so that it can be replaced by an insulator ring of a different inside diameter E.

Lastly, the dark space masking diaphragm or diaphragm ring 28 is replaceable with others of different dimensions so that the marginal etch pit typical of anode sputtering can be shifted from the substrate 18 to the insulator ring 26.

The substrate represented in the drawing is, for example, a silicon wafer of a diameter of 150 mm. The insulator ring in this case has a width B of 15 to 20 mm.

We claim:

1. Apparatus for etching substrates with a luminous discharge in a vacuum, comprising
   a vacuum chamber,
   a substrate holder for holding an at least substantially planar substrate at a situs in said chamber,
   an electrode spaced opposite said situs, said electrode having an approximately cylindrical projecting rim at a common potential with said electrode and extending toward said substrate holder so that a gap is provided between said projection and the plane of said substrate, said electrode further having a diaphragm ring adjacent said gap and extending radially inward from said rim in a plane parallel to the plane of said substrate, a pot-shaped grounded shield at least partially enclosing said electrode and overlapping said rim,
   an insulator ring of electrically insulating material supported by said grounded shield and extending radially inward from said grounded shield toward said situs at least substantially in the plane of said substrate, and
   a radio frequency generator with an output frequency above 100 kHz, said generator having output electrodes respectively connected to said electrode and to said substrate holder, whereby the luminous discharge is limited to the space between the electrode and the substrate holder.

2. Apparatus as in claim 1 wherein said pot-shaped grounded shield comprises a grounded shielding ring extending radially inward in the plane of said substrate, said insulator ring being supported by said shielding ring in the plane of said shielding ring.

3. Apparatus as in claim 2 wherein the shielding ring and the insulator ring define a plane, said plane parallel to and spaced from a second plane defined by said diaphragm ring.

4. Apparatus as in claim 1 wherein the diaphragm ring partially overlaps the insulator ring, the width of the insulator ring being 15 to 20 mm.

5. Apparatus as in claim 1 further comprising at least one opening in the projecting rim of the electrode and at least one opening in the grounded shield, said openings having a width of 5 to 10 mm and being offset from each other to assure a gas exchange.

6. Apparatus as in claim 1 further comprising a grounded shielding and igniting plate disposed directly underneath the substrate holder, so that burning of an additional plasma behind the substrate is prevented, especially in the case of a substrate holder provided with openings.

* * * * *

UNITED STATES PATENT AND TRADEMARK OFFICE
CERTIFICATE OF CORRECTION

PATENT NO. : 4,954,201
DATED : September 4, 1990
INVENTOR(S) : Latz et al.

It is certified that error appears in the above-identified patent and that said Letters Patent is hereby corrected as shown below:

On the title page

Item, [30] Foreign Application Priority Data,
  change "3855153" to -- 3835153 --.

Signed and Sealed this

Eighteenth Day of August, 1992

*Attest:*

DOUGLAS B. COMER

*Attesting Officer*    Acting Commissioner of Patents and Trademarks